(12) United States Patent
Stites (10) Patent No.: US 6,324,330 B1
(45) Date of Patent: Nov. 27, 2001

(54) FOLDED LIGHT TUNNEL APPARATUS AND METHOD

(75) Inventor: David G. Stites, Los Altos, CA (US)

(73) Assignee: Ultratech Stepper, Inc., San Jose, CA (US)

(*) Notice: Subject to any disclaimer, the term of this patent is extended or adjusted under 35 U.S.C. 154(b) by 0 days.

(21) Appl. No.: 09/613,012

(22) Filed: Jul. 10, 2000

(51) Int. Cl.[7] .................................................. G02B 6/00
(52) U.S. Cl. .................................... 385/133; 353/20
(58) Field of Search .................... 385/31, 36, 47, 385/133, 147, 901; 359/434, 435, 501; 362/385; 349/10; 353/20; 257/59

(56) References Cited

U.S. PATENT DOCUMENTS

| | | | |
|---|---|---|---|
| 5,519,532 | * 5/1996 | Broome | 359/435 |
| 5,852,693 | 12/1998 | Jeong | 385/47 |
| 5,975,703 | * 11/1999 | Holman et al. | 353/20 |
| 6,049,364 | * 4/2001 | Takahara et al. | 349/10 |
| 6,213,606 | * 4/2001 | Holman | 353/20 |
| 6,218,679 | * 4/2001 | Takahara et al. | 257/59 |

* cited by examiner

Primary Examiner—Akm E. Ullah
(74) Attorney, Agent, or Firm—Allston L. Jones (57) ABSTRACT

A folded light tunnel apparatus and method of providing light with a high degree of spatial uniformity in a compact arrangement. The light tunnel (100, 190, 300, 350) comprises plurality of prisms (110, 310) having a different cross-sectional dimension (W) and at least one beveled end (110E) having a corresponding beveled end face (110F) through which light reflected by the beveled end passes. The plurality of prisms are arranged adjacent one another in a either two-dimensional or three dimensional stack, with each beveled end face arranged adjacent another beveled end face such that light reflected from one beveled end is received by said adjacent beveled end face and coupled into the adjacent prism. The width of the prisms is governed by a scaling factor (K or K') that depends on whether the prism stack is two-dimensional or three-dimensional. Designing the light tunnel according to the scaling factor allows for the light tunnel to be theoretically 100% efficient in the transmission of light.

38 Claims, 8 Drawing Sheets

FOLDED LIGHT TUNNEL APPARATUS AND METHOD

FIELD OF THE INVENTION

The present invention relates to light tunnels, and in particular to light tunnels used to provide a light distribution having a high degree of spatial uniformity.

BACKGROUND OF THE INVENTION

The use of a hollow or solid rectangular (or square) reflective light tunnel or solid glass rod (herein collective referred to as "light tunnels") is well known as a non-imaging device that can generate a "uniform" intensity distribution from a non-uniform spatial intensity distribution produced by a light source, such as from an arc lamp or laser.

Most light tunnels are designed to provide uniformity of illumination up to about the 95% level (i.e., 5% non-uniformity). However, for certain applications such as photolithography and laser thermal processing (LTP), the spatial uniformity needs to exceed 99% (i.e., less than 1% non-uniformity). To achieve this level of uniformization, the light tunnel must have a length to width ratio on the order of 100:1 to provide the necessary large number of homogenizing reflections (typically more than 4 reflections in each direction).

Figure 1:
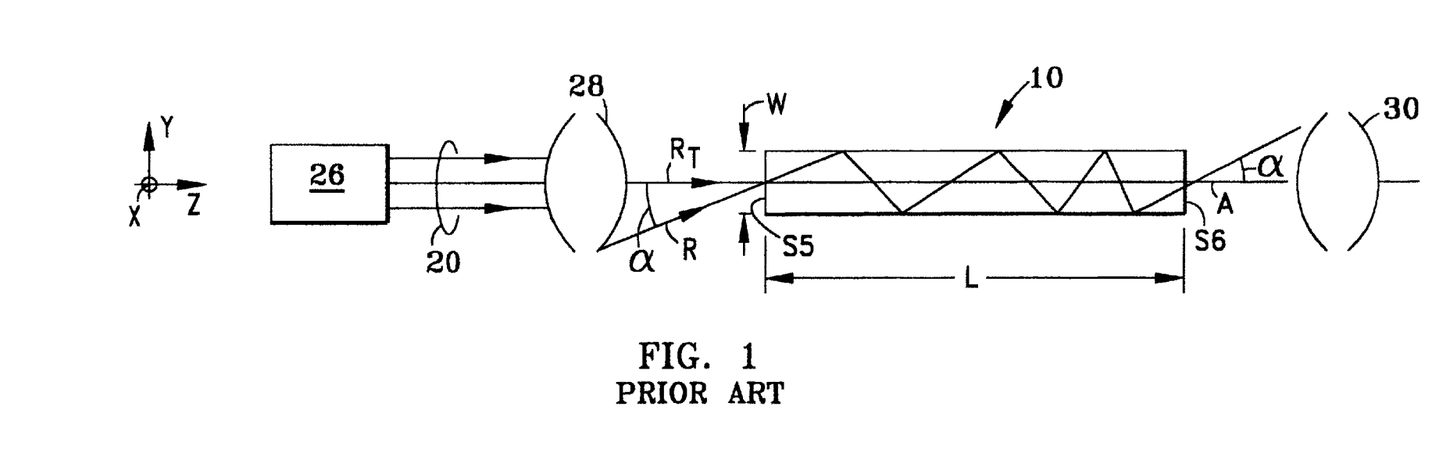
FIG. 1 is a schematic cross-sectional diagram of a prior art light tunnel system used to provide spatially uniform illumination from a relatively non-uniform light source.
Figure 2:
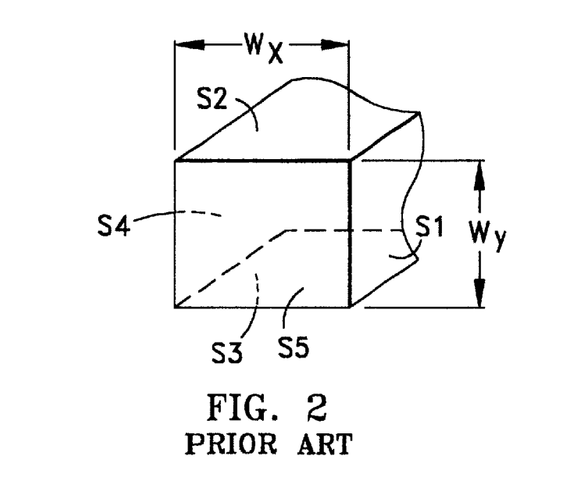
FIG. 2 is a close-up view of the input end of the light tunnel shown in FIG. 1, showing the input end and the sides.
Figure 3:
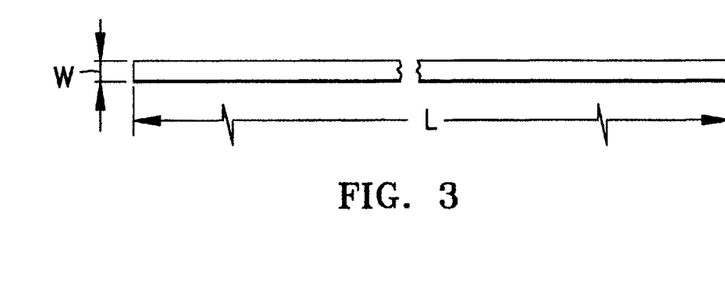
FIG. 3 is schematic cross-sectional diagram of a light tunnel having a ratio of width W to length L of 1:100.

FIG. 1 shows an example of a non-imaging light tunnel 10 having an optical axis A along the z-direction, a width W=5.7 mm and a length L=500 mm. Light tunnel 10 is solid and may be made of optical glass, such as fused silica having a refractive index n=1.45 in the visible spectrum. With reference also to FIG. 2, light tunnel 10 is polished with six mutually perpendicular surfaces S1–S6, which includes 4sides (S1–S4), an input end (S5) and an output end (S6). Surfaces S1–S6 meet at sharp edges and are straight and flat over their extent. Light tunnel 10 having such dimensions is very fragile and difficult to fabricate. FIG. 3 shows light tunnel 10 having the proportion W/L of 1/100 for the sake of illustration. The above dimensions are close to a practical limit of both manufacturability and sensible cost.

Figure 4A:
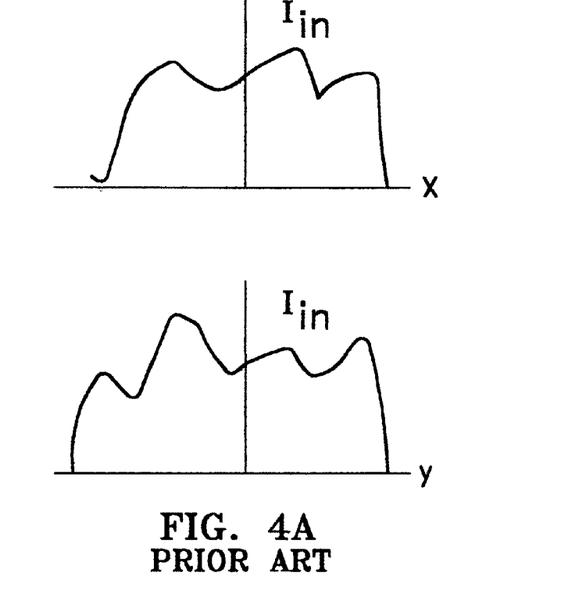
FIG. 4A shows cross-sectional plots (x and y) of an input intensity $I_{in}$ as might be measured at the input end of the light tunnel of FIG. 1.

In use, light tunnel 10 functions as follows. With reference again to FIG. 1, a light beam 20 comprising light rays R (including a straight-through light ray $R_T$) from a light source 26 is relayed via an optical relay system 28 and converged onto input end S5 through an input angle α. The spatial extent of light beam 20 imaged onto input end S5 is typically somewhat circular with a reasonably symmetric spatial intensity distribution. The spatial uniformity of light beam 20 in the x and y directions is shown schematically in FIG. 4A. Light beam 20 is preferably defocused so that it just underfills input end S5 and does not concentrate energy above the Laser Damage Threshold (LDT) of the optical glass from which the light tunnel is fabricated.

A reasonable value of a is found to be about ±10° (half-cone angle), which corresponds to a numerical aperture (in air) of 0.18 or an f/# of f/2.8. Larger numerical apertures present additional problems in managing the output illumination, which has an output angle α, the same as the input angle. Somewhat "faster" f/#s can be used, depending on the complexity and expense the optical system can endure for the downstream relay optics 30 that relays light from output end S6 through other sections of the optical system (not shown).

It is known in the art that the longer the light tunnel, the greater the spatial uniformity of the illumination formed on output end S6 because the spatial uniformity increases with a larger number of reflections, and, for a given input f/#, it is possible to have a greater number of reflections with a longer light tunnel. Normally, output end S6 has cross-sectional dimensions $W_x$ and $W_y$, so that the light tunnel may be square or rectangular. In FIG. 1, $W_x=W_y=W$, for the sake of simplicity.

With continuing reference to FIG. 1, all light rays R in beam 20 entering input end S5 of light tunnel 10 exit from output end S6, provided that the refractive index of the optical glass $n > (2)^{1/2}$ or 1.414 . . . for the given wavelength of light used. Virtually all optical glasses exceed this value. Hence any light ray that enters input end S5 at α=90° or less will refract and be guided down the tunnel's length by multiple-reflections from surfaces S1–S4 of light tunnel 10, and exit at ±α from output end S6. Every light ray R will undergo an "even" or "odd" number of reflections, depending on the length L and incident input angle α. Because light rays R in a solid light tunnel 10 undergo Total Internal Reflection (TIR), there is no light loss internally due to reflection. Absorption and scattering in the optical glass and "end" losses due to Fresnel surface reflections are the only losses encountered. Anti-reflection coatings can minimize the latter.

It is possible to construct a rectangular hollow light tunnel 10 by butting together four mirrors. Other than the "internal medium" being air with a refractive index of 1.0, the geometrical behavior is, to first order, identical to that of a solid light tunnel. For a given width W, a hollow light tunnel 10 will be the shortest embodiment for a given number of reflections or "bounces" of rays R from input end S5 to output end S6. That is, a hollow light tunnel 10 will produce the most uniform output distribution in the shortest length L. Even so, the length L must be great, requiring long slender mirrors. The edges that butt to the surface of the adjacent mirror must be sharp. Dirt on the inside reflective surfaces can be a practical problem. The inner surfaces of the mirrors preferably include an optical coating designed for grazing incidence reflection to avoid excessive polarization and selective absorption. A mirror-based hollow light tunnel will not be as efficient as a solid glass light tunnel when reflection losses from the mirrors are compared to TIR of solid glass.

For given values of α, $W_x$, $W_y$, L and n, the number of reflections that occur on either side of the directly transmitted ray $R_T$ traveling along axis A is limited by α and will be equal to $N_{xy}$, which is given by:

$$N_{xy} = \pm \text{Tan}(\text{Sin}^{-1}(1/(2 \times n \times f/\#)))(L/W), \quad \text{(Eq-1)}$$

$$\text{where } f/\# = 1/(2 \sin \alpha) = 1/(2NA) \quad \text{(Eq-2)}$$

For a circular beam, the total number of reflections is given by $N_{tot}$:

$$N_{tot} = (\pi/4)(2N_{xy}+1)^2 \quad \text{(Eq-3)}$$

For L=500, $W_x=W_y=W=5.7$, n=1.43, and f-number=f/2.8, $N_{xy}=\pm 11$ reflections either side of the transmitted beam, which gives $$N_{tot} = 415 \text{ reflections.}$$

The angular subtense of a single beam is given by:

$$\Delta\alpha = \text{Tan}^{-1}(nW/L) \quad \text{(Eq-4)}$$

which for α=±10.30 half-cone angle results in each beamlet subtending an angle of 0.95°.

For small angles α, the number of reflections $N_{xy}$, is approximated by:

$$N_{xy} \cong (\pm \alpha)/(nW/L) \quad \text{(Eq-5)}$$

Figure 4B:
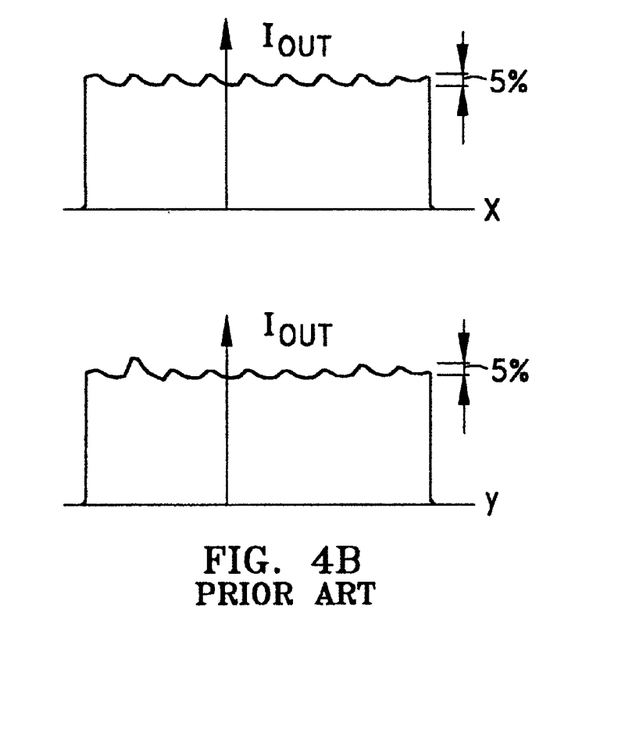
FIG. 4B shows cross-sectional plots (x and y) of an output intensity $I_{out}$ as might be measured at the output end of the light tunnel of FIG. 1.

Hence, there will be at output end S6 an average of 415 superimposed images of input end S5. The result is a highly spatially uniform distribution of light $I_{out}$ at output end 56 that is sharp-edged and behaves as an ideal light source. This is illustrated in FIG. 4B.

The problem with the foregoing is that when W needs to be much larger than 5 mm, or L much longer than 500 mm (i.e., about 20 inches), serious fabrication difficulties are encountered. In particular, the light tunnel is slender and fragile and thus difficult to handle and easily damaged in processing (see FIG. 3). It becomes necessary to increase the width, W, of the tunnel when high intensity light sources, such as lasers, are used. For example, lasers with high energy/pulse characteristics (approximately greater than 5 joule/cm²/pulse with a wavelength in the visible range on most conventional glass tunnels) may exceed the damage threshold. However, increasing the width of the light tunnel necessarily requires that the length also increase so as to maintain the number of reflections required to achieve adequate uniformity. Very quickly, the size of the light tunnel becomes unmanageable.

To reduce the unwieldiness of long light tunnels, it would be desirable to fold them in a manner that allows for the redirection of light with little or no light loses, or increase in etendue. The physical significance of "etendue" or equivalent terms (Lagrange Invariant, optical invariant, etc.) can be stated as follows: the product of the solid angle irradiated by an emitting source and its radiant power-weighted surface area is "constant" when "imaged" throughout an optical system. In other words, (Power)×(Source Area)×(Source Solid Angle)=Constant Simply put, if an optical system is 100% efficient, it can only re-image the source at another location with an equivalent "luminance." Since, owing to losses in optical systems (e.g., surface reflections, vignetting, material absorption and scattering), optics efficiency will be less than 100% and an image of the source will always have a lesser "luminance" than the source itself.

Also important however is the matter of spatial uniformity of an image of the source. A "uniformized" image plane has a uniform illumination distribution. A light tunnel comprises multiple sources (reflected beamlets of the main source), all of which contribute to each point within the illumination distribution at the output end. It can then be said that this surface will have a spatially uniform "luminance" regardless of the "etendue." Hence, any subsequent image of the surface, regardless of whether it is magnified, will produce an image that is as spatially uniform, provided that optics used to re-image this surface are suitably designed.

U.S. Pat. No. 5,852,693 ("the '693 patent) discloses a light-tunnel device that includes the use of "special redirection members" and "special coupling members" to fold the light tunnel. The "special coupling members" are used to join shorter prismatic sections of rectangular or square light tunnels together to form the equivalent of a long light tunnel. However, a significant disadvantage of the '693 patent is the necessity for coupling members in the form of prisms that connect square-ended light tunnel segments ("rods") together. The coupling prisms need to have a higher-refractive index than the "rods." This arrangement is designed to reduce the divergence of rays leaving each rod through a coupling prism and thereon entering the next rod, etc. In the '693 patent, the joints between adjacent prisms and rods need to have some special treatment, e.g., be air spaced when total internal reflection is useful or desired. Alternatively, the joints need to be optically bonded with a suitable adhesive when total internal reflection is not required. Further, the joints need to be coated with a thin-film of a appropriate dielectric layers and/or metal to enhance reflection from either a rod to prism interface or at the angled prism face that would ordinarily be left uncoated for TIR.

SUMMARY OF THE INVENTION

The present invention relates to light tunnels, and in particular to light tunnels used to provide a light distribution having a high degree of spatial uniformity. More particularly, the present invention is an apparatus and method that allows for uniformizing light with a folded light tunnel without the complexities of the '693 patent (such as additional coupling prisms of higher index of refraction) and that is more efficient with regard to the transmission of light. This is accomplished by appropriately scaling the size of the light tunnel sections ("prisms").

Accordingly, a first aspect of the invention is a folded light tunnel apparatus for receiving light at an input end and capable of guiding the light to an output end in a manner that spatially uniformizes the light traveling through the light tunnel. The apparatus comprises a plurality of prisms each having a refractive index, a cross-sectional dimension and at least one beveled end having a corresponding beveled end face. The prisms are arranged adjacent one another in either a two-dimensional or three dimensional stack, with each beveled end face arranged adjacent another said beveled end face such that light reflected from one beveled end is received by the adjacent beveled end face and coupled into the adjacent prism. The cross-sectional dimensions of adjacent prisms are related by a scaling factor K in the case of a two-dimensional prism stack, and by a scaling factor K' in the case of a three-dimensional prism stack. The scaling factors K and K' are set forth in detail below.

A second aspect of the invention is a method of spatially uniformizing light from a light source using a light tunnel having an input end and an output end. The method comprises the steps of first, coupling the light from the light source into the input end of a first prism at an input angle α in a manner that results in light being guided through the first prisms. The first prism has a refractive index n, a first width, a first beveled end and a corresponding first beveled end face. The next step is reflecting the light guided by the first prism at the first beveled end so that the light reflects through the first beveled end face. The next step is then coupling the reflected light into a second prism having a second width, a second beveled end and a corresponding second beveled end face, through the second beveled end face. The first and second widths are related by the scaling factors K or K', mentioned above, depending on the dimensionality of the light tunnel prism stack. The next step is reflecting the light coupled in the second prism at the second beveled end so as to guide the light through the second prism. The final step is then outputting the light at the output end of the light tunnel. The output end of the light tunnel may correspond to the non-beveled end of the second prism (where the number of prisms p=2), but is more generally the end-most prism in the stack of a large number of prisms where p>2.

A third aspect of the invention is a light tunnel optical system having an image plane. The system comprises, in order along a folded optical axis, a light source capable of emitting light, and a first relay optical system for receiving light and relaying the light emitted from the light source. The system further includes the two-dimensional or three-dimensional light tunnel of the present invention, arranged to receive light relayed from the first relay optical system at the input end and output spatially uniformized light at the output end. The system also includes a second relay optical system arranged to receive the spatially uniformized light from the light tunnel output end and relay this light to the image plane, preferably by forming an image of the output end of the light tunnel at the image plane.

DETAILED DESCRIPTION OF THE INVENTION

The present invention relates to light tunnels, and in particular to light tunnels that are used to provide a light distribution having a high degree of spatial uniformity. The present invention enables a long light tunnel to be built from a folded assembly of smaller, more easily manufactured light tunnel sections (solid or hollow), referred to herein as "prisms."

The present inventor has discovered that an otherwise long light tunnel can be folded without having to use "special coupling members" between each folded light tunnel section (prism). The folding is accomplished by appropriately scaling each prism to account for the divergence of rays leaving one prism and entering the next. This is commonly done to support an imaging path when multiple prisms (or mirrors) are juxtaposed to support an image bundle without vignetting. However, it is not immediately apparent that it is necessary to obey similar scaling constraints when folding a non-imaging light tunnel.

The subtlety of the problem relates to the reflection of rays off the inside walls of non-imaging light tunnel prisms. In an imaging prism path, the light rays are deliberately kept away from the sidewalls and travel through the prism in a well-defined ray bundle of a predetermined shape. However, with a non-imaging bundle of rays, all of the light that reflects internally off the reflecting sides of the prisms must be considered. Normally, such rays are not considered as part of an imaging bundle of light.

By making adjoining prisms have successively greater cross-sectional widths, all the light leaving one prism will enter the adjoining prism so that no light is lost. Hence, the efficiency, apart from normal losses of any embodiment of the folded light tunnel of the present invention, can be theoretically perfect i.e., 100% throughput. Accordingly, an otherwise long light tunnel (i.e., long prism) can be created from any number of shorter sections (i.e., shorter prisms) that are optically joined by forming appropriate reflecting surfaces in each prism. These shorter prisms can be manufactured and assembled more economically than a single long light tunnel prism, particularly when the aspect ratio of the latter exceeds 100:1, or the unfolded light tunnel length is greater than 500 mm. This is also an especially valuable technique for long light tunnels where the cross-section is larger than 5 mm. Such light tunnels are used to support a high energy density, or to create a relatively large output surface for downstream relay optics that re-image the light tunnel output to an object or object plane in an optical system.

2-D Folded embodiment

Figure 5:
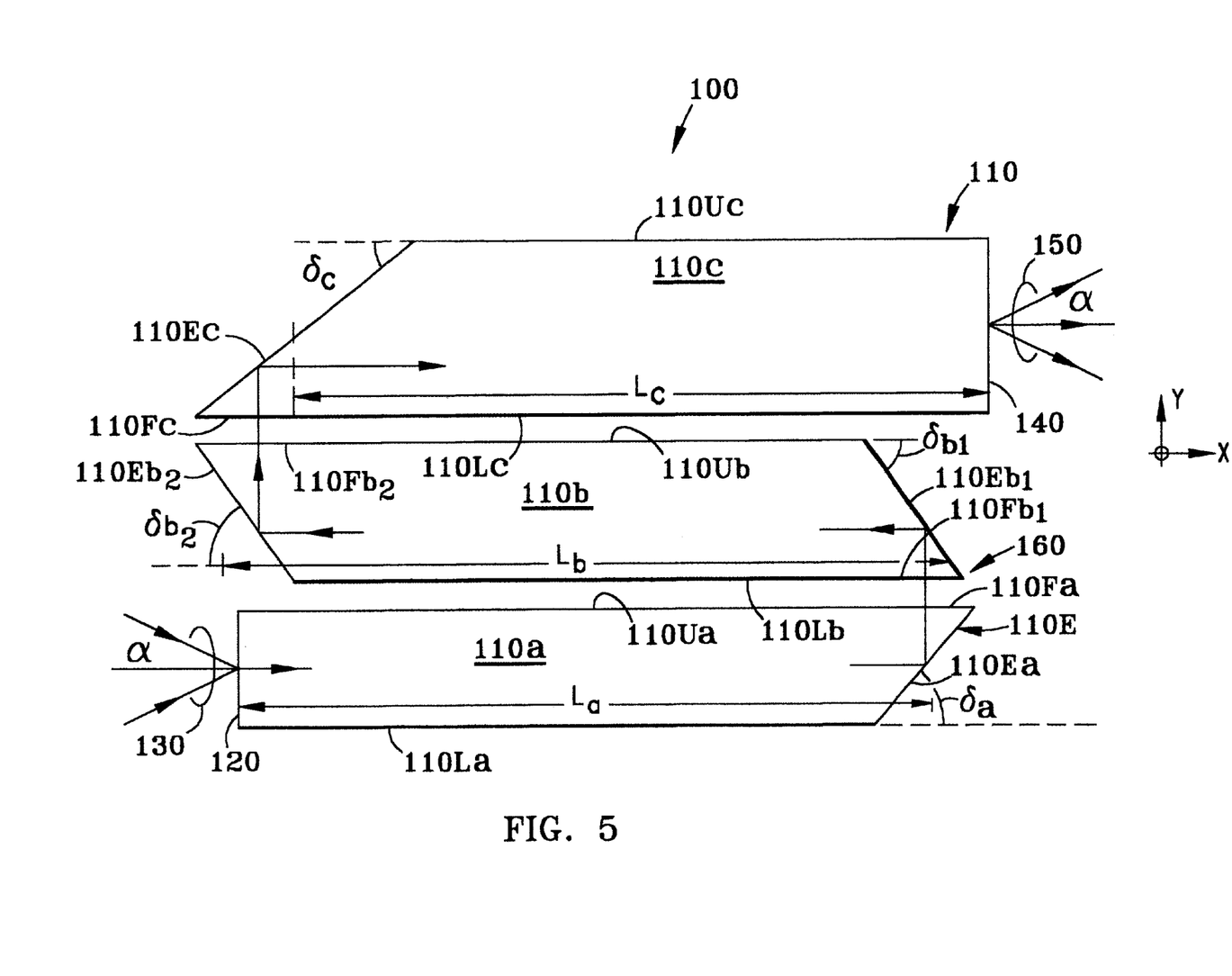
FIG. 5 is a cross-sectional schematic diagram of the two-dimensional folded light tunnel of the present invention comprising three prisms.
Figure 6:
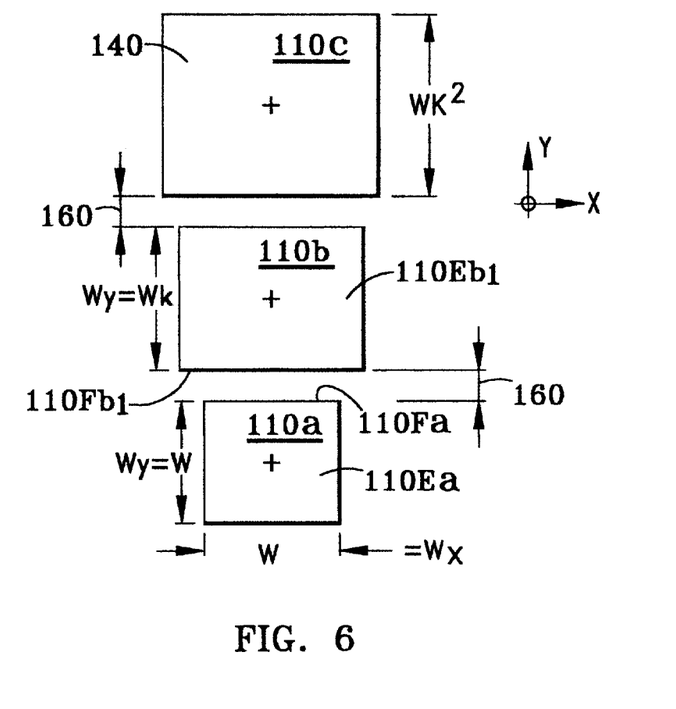
FIG. 6 is an end-view of the two-dimensional three-prism folded light tunnel of FIG. 5, illustrating the increasing widths of the prisms, wherein the gap is small and not drawn to scale.
Figure 7:
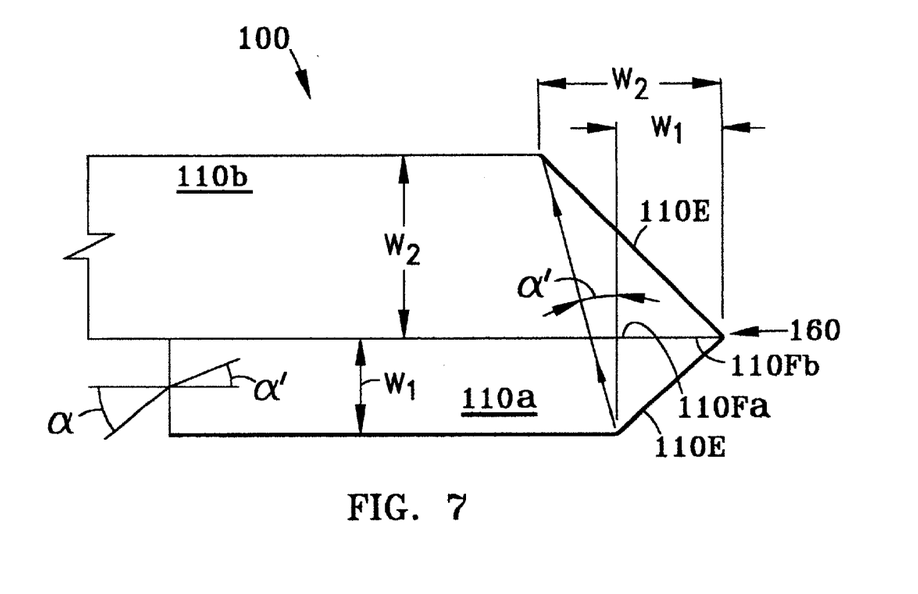
FIG. 7 is a close-up view of the first and second prisms of the two-dimensional folded light tunnel of FIG. 5, showing the relationship between the width of the prisms, the input angle ($\alpha$) and the refracted angle ($\alpha'$)

With reference now to FIGS. 5–7, there is shown a two-dimensional (2-D) folded light tunnel 100 comprising two or more light tunnel segments (i.e., "prisms") 110 (three such prisms 110a, 110b and 110c are shown in FIG. 5) each having an upper surface 110U, a lower surface 110L, and a beveled end 110E with a bevel angle δ. Light passing through prism 110 reflects off beveled end 110E and passes through a portion of upper surface 110U referred to herein as the "beveled end face" 110F.

For the three prism design of light tunnel 100, first prism 110a has a single beveled end 110Ea with a bevel angle δa, a corresponding beveled end face 110Fa, an upper surface 110Ua, and a lower surface 110La. Second prism 110b has two beveled ends 110Eb$_1$ and 110Eb$_2$ each with a bevel angle δb$_1$ and δb$_2$ and corresponding beveled end faces 110Fb$_1$ and 110Fb$_2$, as well as an upper surface 110Ub and a lower surface 110Lb. Third prism 110c has a single beveled end 110Ec with a bevel angle δc and a corresponding beveled end face 110Fc, as well as an upper surface 110Uc and a lower surface 110Lc.

This numbering scheme is extendable to a light tunnel having any number of prisms in that the input prism 110a (i.e., the prism into which light is input) will have a single beveled edge 110Ea and one beveled edge face 110Fa, and the output prism (i.e., the prism from which the light finally exits the light tunnel) will have a single beveled edge 110E (e.g., edge 110Ec for light tunnel 100) and single beveled edge face 110F (e.g., edge 110Fc for light tunnel 100). The prisms in between will have two beveled ends are corresponding beveled end faces.

Prisms 110 are comprised of an optically transparent material for the wavelength of radiation used, such as glass or crystal for visible wavelength radiation. For example, prisms 110 can be comprised of fused silica glass, available from Corning Glass, Inc., Corning, N.Y., or a glass such as F2 or BK7, available from Schott, Inc, of Duryea, Pa. or Ohara, Inc. of Kanagawa, Japan. Prisms 110 can also be made of optically transparent plastic materials. Further, prisms 110 can have a variety of shapes and sizes, are usually desired to be tabular or slab-like, formed by cutting, polishing or molding the material to a suitable shape.

Prisms 110 are stacked in a plane such that light entering one prism at an input end 120 as an input beam 130 will have a light path within the prisms that is folded back and forth in "zig-zag" fashion by virtue of the placement of beveled end faces 110F adjacent one another. The light then exits the end-most prism 110 (e.g., prism 110c) at an output end 140 as an output beam 150 after traversing a folded length roughly equal to that of the equivalent unfolded long light tunnel. The use of an odd-number (greater than 1) of prisms 110 results in output beam 150 continuing on in the same direction as input beam 130 (i.e., the x-direction), except for a lateral offset (i.e., a shift in the y-direction).

A 2-D folded light tunnel 100 comprising 2 to 5 prisms will be sufficient for most applications. For a light tunnel 100 having an otherwise unfolded length L of 500 mm, a good choice for the length $L_a$ of first prism 110 (110a) is approximately 150 mm. The lengths $L_b$ and $L_c$ of the remaining two prisms 110b and 110c can be scaled up from length $L_a$. A small amount of additional length ($\Delta L$) is preferably added to first prism 110a so lower surface 110Lb of adjacent prism 110b does not interfere with input light beam 130.

First prism 110a has a width in the x-direction $W_x$ and a width in the y-direction $W_y$. For the sake of simplicity, the remaining discussion assumes $W_x = W_y = W$. Prisms 110, when solid, comprise an appropriate material of refractive index n and good transmission at the wavelength of light used. The input ray angle $\alpha$ (i.e., half-cone angle, NA or f/#) measures the divergence of input beam 130 and is also the output ray angle.

Prisms 110 are mounted adjacent one another in the y-direction in close proximity to each other with beveled end faces 110F in opposition. There is preferably a physical gap 160 between adjacent prisms that is perhaps as small as 0.001" inch (25 $\mu$m) or as large as 0.01" (0.25 mm). This gap is necessary for lossless transmission. Gap 160 is preferably smaller than 0.01", since a larger gap will cause the subsequent prisms to increase appreciably in size. For optimum light guiding performance, gap 160 should be large enough to prevent light loss due to frustrated total internal reflection (FTIR) between adjacent prisms.

It may be preferable in the present embodiment as well as those described below, that the prisms be made of a high-index material with a low-index optical adhesive used to fix the prisms to each other and to fill gap 160.

By assuming that the optimum fold angle (or practical angle) is 90° at each beveled end 110E, prisms 110 can be fabricated with a customary bevel angle $\delta=45°$ that "folds" the ray-path to the next prism through beveled end face 110F at 90°. While there are other bevel angles $\delta$ that may truly be more optimum, if prisms 110 are to lay parallel to each other for ease of packaging, then bevel angles $\delta$ such that a 90° fold angle results should be used. However, the principles discussed herein extend to other bevel angles and resultant fold angles.

The relationship between widths W of adjacent prisms 110 in 2-D folded light tunnel 100 follows a scaling factor K. For example, if $W_1$ is the width of prism 110a, $W_2$ is the width of prism 110b, etc., then:

$$K=W_2/W_1=W_3/W_2=W_{m+}/W_m \quad \text{(Eq-6)}$$

With reference to FIG. 7, scaling factor K can be derived by trigonometry and is given by:

$$K=\{(1+(1-(2\cos\alpha'-1)^2)^{(1/2)}\}/(2\cos\alpha'-1) \quad \text{(Eq-7)}$$

$$\text{where } \alpha=\text{ArcSin}(1/2f/\#) \quad \text{(Eq-8)}$$

$$\alpha'=\text{ArcSin}\{(\text{Sin}\_a)/n\}. \quad \text{(Eq. 9)}$$

For f/#=1, $\alpha=30°$, $\alpha'=19.2°$, n=1.52 (for Bk7 glass) and $\delta=45°$, then K=1.64.

Hence, second prism 110b has a width $W_2=1.64\times$ larger than width $W_1$ of first prism 110a, and the third prism 110c has a width $W_3=2.69\times$ larger than width $W_1$ of first prism 110a.

For f/#=2.5 $\alpha=11.53°$, $\alpha'=7.56°$, n=1.64 (Bk7) and $\delta=45°$ then K=1.2.

Making the refractive index n larger reduces $\alpha'$ and thus reduces the scaling ratio K. However, to get the same number of internal reflections, the unfolded length L of light tunnel 100 must be made inversely longer as n is increased. In general, it is preferred to try to keep prisms 110 close to the same size. A larger refractive index n 5 can help in this regard. Keeping the f/# as "slow" (large) as possible can also help. But the larger the f/#, the longer the unfolded length L must be for the same degree of uniformity or number of reflections.

Generally, the f/# is dictated by the "speed" of the optical system (not shown) downstream of light tunnel 100. In certain applications, output end 140 of light tunnel 100 is magnified further downstream in the system. By knowing the number $N_p$ of prisms 110 to be used, the magnification of output end 140 can be accounted for via the factor $K^{(Np-1)}$. For $N_p=3$ (e.g., three prisms, as in the above example shown in FIG. 5) and for f/2.5, the magnification factor at output end 140 is 1.4x. Hence, if output end 140 of a conventional, unfolded light tunnel needs to be magnified by 2x, the downstream relay optics would now only have to magnify the output end of the folded light tunnel by a factor of M=2/1.4=1.43x. This would also affect the working f/# at the light tunnel, if it were established by the working f/# of the final image. For example, assume the working f/# of the final image is f/5.6. With a relay magnification of 1.43x, the f/# at the output of the folded light tunnel would be 5.6/1.43=f/3.9. However, the f/# of a conventional unfolded light tunnel would be 5.6/2=2.8. This means the folded light tunnel must be increased in length L compared to an unfolded light tunnel to produce the same number $N_p$ of internal reflections. That increase is roughly proportional to the ratio of the new f/# to the old one, or 3.9/2.8=1.4x longer than the length of the unfolded light tunnel.

Figure 8:
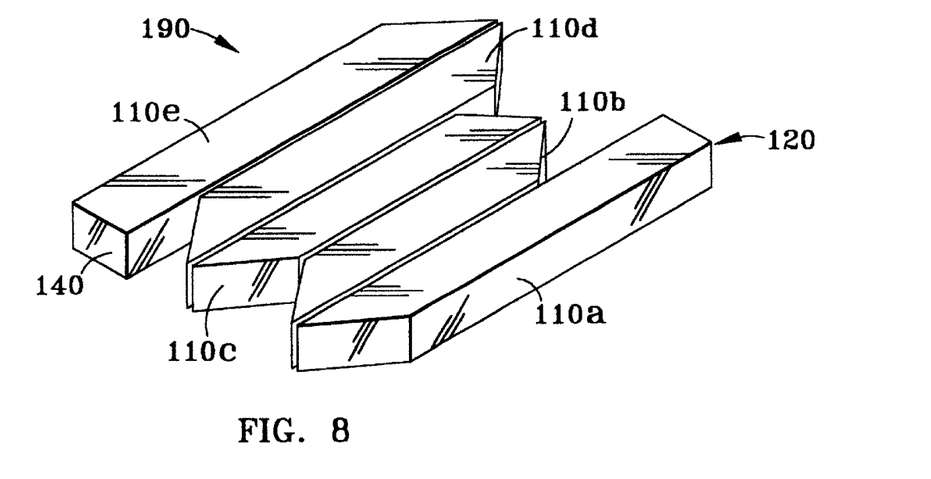
FIG. 8 is a perspective view of an example of a two-dimensional folded light tunnel of the present invention comprising five prisms.

FIG. 8 shows a five-prism 2-D folded light tunnel 190 comprising five prisms 110a–110e, based on the same principles as discussed above for the three-prism 2-D folded light tunnel design of light tunnel 100.

3-D Folded Embodiment

Figure 9:
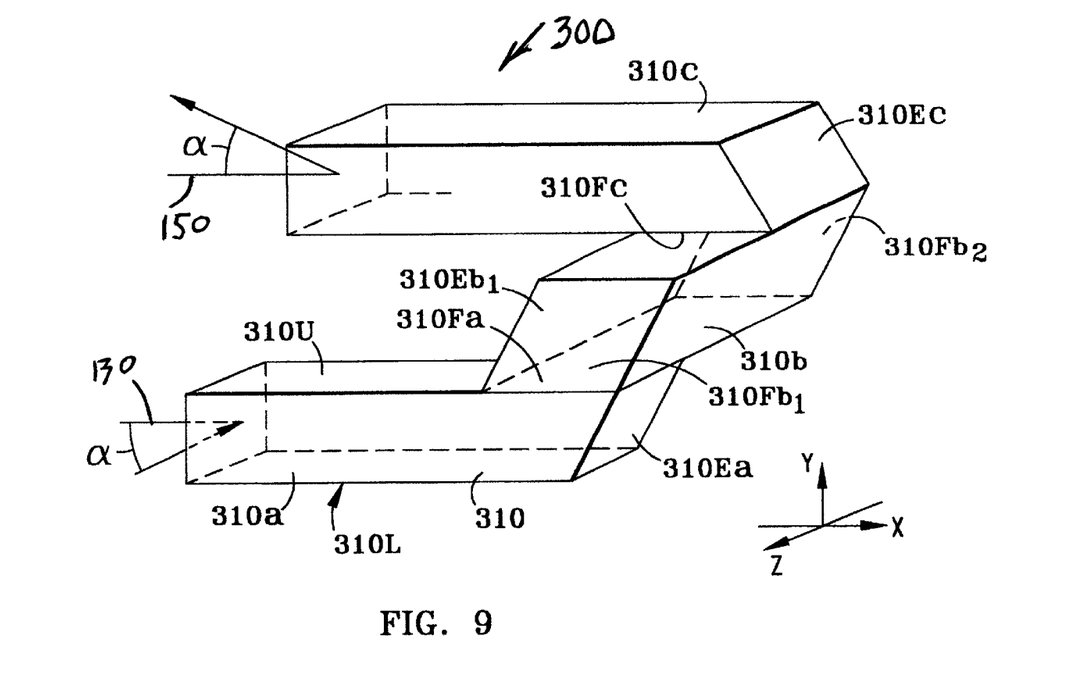
FIG. 9 is a perspective view of a three-dimensional folded light tunnel of the present invention comprising three prisms.

With reference now to FIGS. 9–12, there is shown a three-dimensional (3-D) folded light tunnel 300 comprising two or more light tunnel segments (i.e., "prisms") 310 (three such prisms 310a, 310b and 310c are shown in FIG. 9) each having an upper surface 310U, a lower surface 310L, and a beveled end 310E with bevel angle δ. The reference number scheme is analogous to the 2-D embodiment described above (e.g., first prism 310a has upper and lower surfaces 310Ua and 310La, a beveled end 310Ea with a beveled angle δ and an associated beveled end face 310Fa, etc.).

Prisms 310 are arranged with beveled end faces 310F adjacent one another so as to form a 3-D stack that spirals progressively upward as each prism is added to the next in spiral staircase fashion. The stack preferably has a square shape, i.e., the prisms intersect at 90-degree angles, though other stack shapes formed with different intersection angles are possible. Five prisms 310 can be used to make a square stack wherein the direction of output beam 150 is the same as that of input beam 130, except for a lateral offset (i.e., offset in the y-direction in FIG. 9). As in the 2-D folded embodiment described above, prisms 310 are preferably separated by a small air gap 160.

As in the 2-D case, the relationship between adjacent prism widths W in the 3-D folded light tunnel is governed by a scaling factor K':

$$K'=W_2/W_1=W_3/W_2=W_{m+1}/W_m. \quad \text{(Eq-10)}$$

Figure 10:
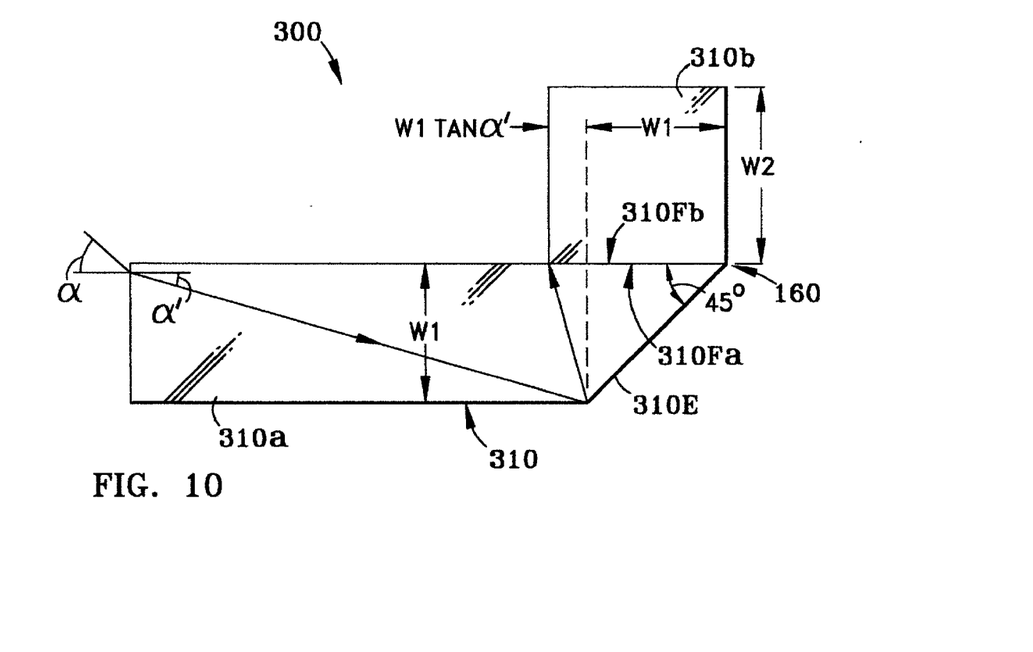
FIG. 10 is a close-up view of the first and second prisms of the three-dimension folded light tunnel of FIG. 9, showing the relationship between the width of the prisms, the input angle ($\alpha$) and the refracted angle ($\alpha'$)

With reference to FIG. 10, 3-D scaling factor K' is given by:

$$K'=1+\{(\sin \alpha)/((n^2-\sin^2\alpha)^{(1/2)})\} \quad \text{(Eq-11)}$$

Where α and α' and n are as defined above, and as shown in FIG. 10.

For f/#=1, α=30°, α'=19.2°, n=1.52 (Bk7 glass) and δ=45°, K'=1.35, which is about 80% of the scale factor required for the 2-D case for the same parameter values.

Hence, the second prism 310b is 1.35× larger than first prism 310a, and third prism 310c is 1.82× larger than first prism 310a. For a five-prism design light tunnel 350 shown in FIG. 11 comprising five prisms 310a–310e, fifth prism 310e is 3.30× larger than first prism 310a. Because the width W5 of fifth prism 310e is starting to get relatively large compared to width W₁ of prism 310a, a 3-prism configuration may be the preferred choice for certain applications requiring fast f/#s (e.g., f/1).

Figure 11:
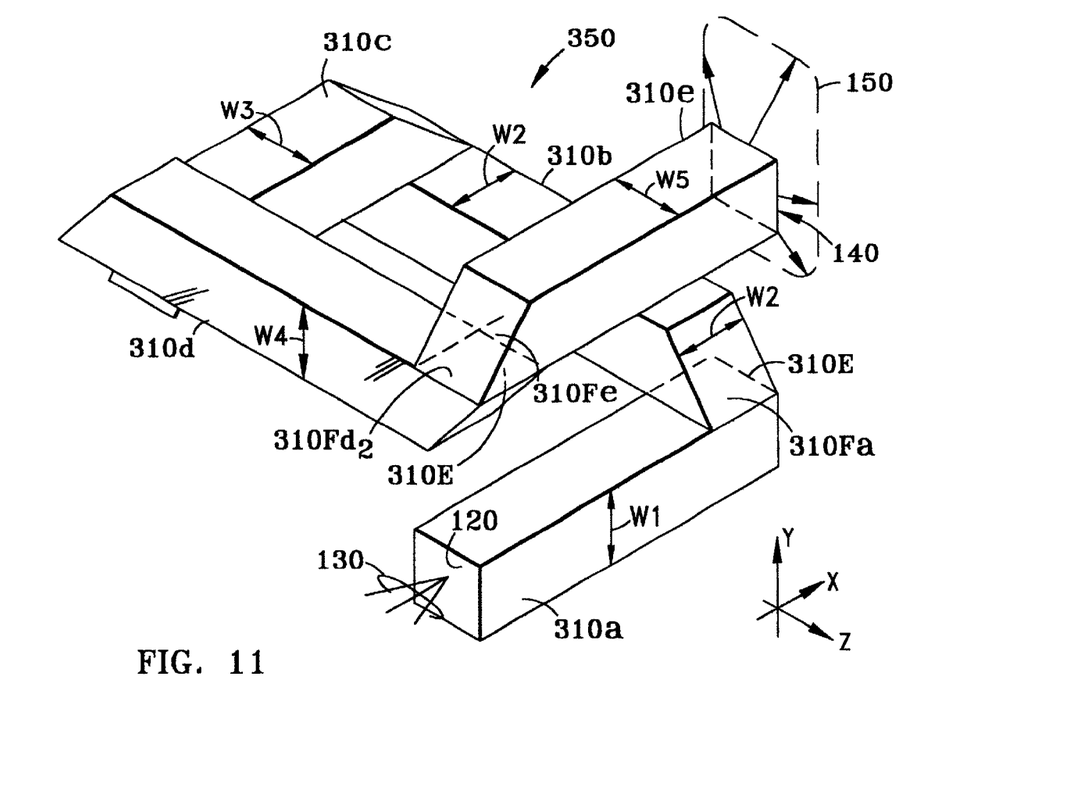
FIG. 11 is a perspective view of an example of a three-dimensional folded light tunnel of the present invention comprising five prisms.
Figure 12:
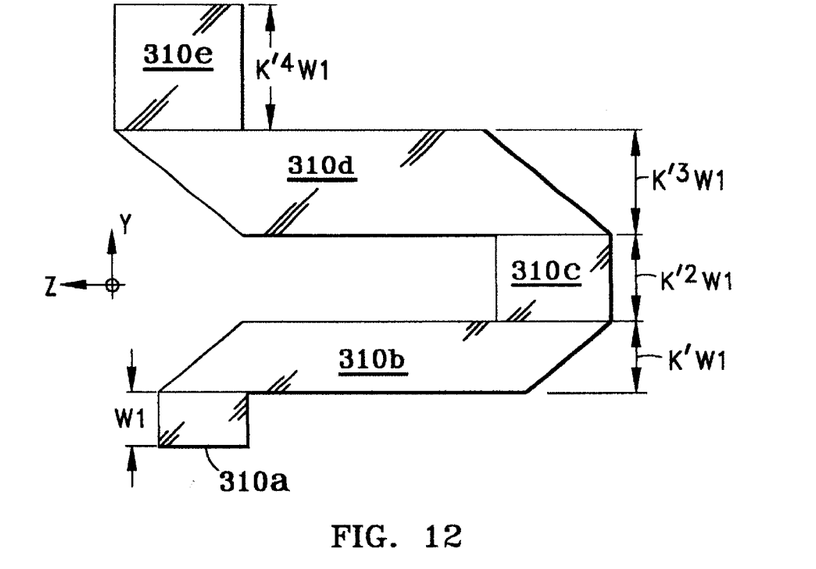
FIG. 12 is an end-view of the light tunnel of FIG. 11, i.e., as viewed along the –x direction.

For f/#=2.5α=11.53°, α'=7.56°, n=1.64 (Bk7) and δ=45°, K'=1.09×. Hence, second prism 310b is 1.09× larger than first prism 310a, third prism 310c is 1.184× larger than first prism 310a, and fifth prism 310e is 1.4× larger than first prism 310a. Hence, a five-prism light tunnel comprised of relatively short prisms 310 (e.g., 100 mm each) makes for a compact light tunnel as compared to an unfolded 500 mm light tunnel.

For a given wavelength of light, there are limitations as to the choice of materials that can or should be used so as to minimize internal absorption losses. The material choices tend to be limited to low to medium refractive index optical materials, such as fused silica, borosilicate glass, etc. Laser damage threshold and other special requirements imposed by fabrication issues may necessitate or limit a special selection of materials. Further, the performance of various designs can be evaluated and optimized using non-sequential ray tracing. An exemplary computer program for carrying out such analysis is ZEMAX-EE, by Focus Software, Inc., of Tucson, Ariz.

Because of the asymmetric nature of the light tunnels of the present invention, the same uniformization properties are not obtained if the light tunnels were to be used in reverse. Injecting light into the output end to create a smaller but uniform light distribution at the input end would result in light losses when the light rays pass from one prism to the next. Accordingly, the light tunnels of the present invention are best suited for transforming a smaller irregular (non-uniform) ray bundle that fits wholly within the input end, into a larger uniform ray bundle at a the output end.

Losses due to reflection at the input and output ends of the 2-D or 3-D folded light tunnels can be reduced through the use of anti-reflection coatings. Such coatings can be applied by a wide variety of commercial sources, including Optical Coatings, Inc., of Santa Rosa, Calif., or CVI, Inc, of Albuquerque, N.Mex.

Alternatively, the input surface or another surface of the folded light tunnel of the present invention may intentionally be provided with a degree of surface roughness to create a diffusing effect. In this case, some scattering losses will be encountered, but the ability to integrate a diffuser into the folded light tunnel may provide a benefit to the illumination uniformity that outweighs the loss of light.

Likewise, a diffracting pattern, such as a grating, a hologram, or binary optic may be integrated into the folded homogenizer at the input or output ends to impart a desireable phase and/or direction characteristic to the light entering the light tunnel.

Symmetric and Asymmetric Optimized Solutions

The light tunnel embodiments described above utilize prisms having beveled ends that are asymmetric when compared to an adjacent beveled end. This asymmetry minimizes the scaling factors K and K', and results in an optical axis that does not travel down the center of each successive prism. As a consequence, the multiply reflected beamlets (rays) do not form a symmetrical multi-source array. Surprisingly, illumination uniformity does not appear to be harmed by this asymmetry. This case represents an asymmetric optimized solution.

A symmetric optimized solution has the optical axis traveling down the center of each prism. This requires slightly larger scaling factors K and K', so that larger prisms will be required to collect all the rays and preserve centration of the optic axis and symmetry in the array of multiple source reflections.

Regardless of whether a symmetrical or asymmetrical condition is chosen, the output uniformity can be made as uniform as required by the use of an appropriate folded length of prisms using the techniques described above.

Folded Light Tunnel-based Optical Systems

Figure 13:
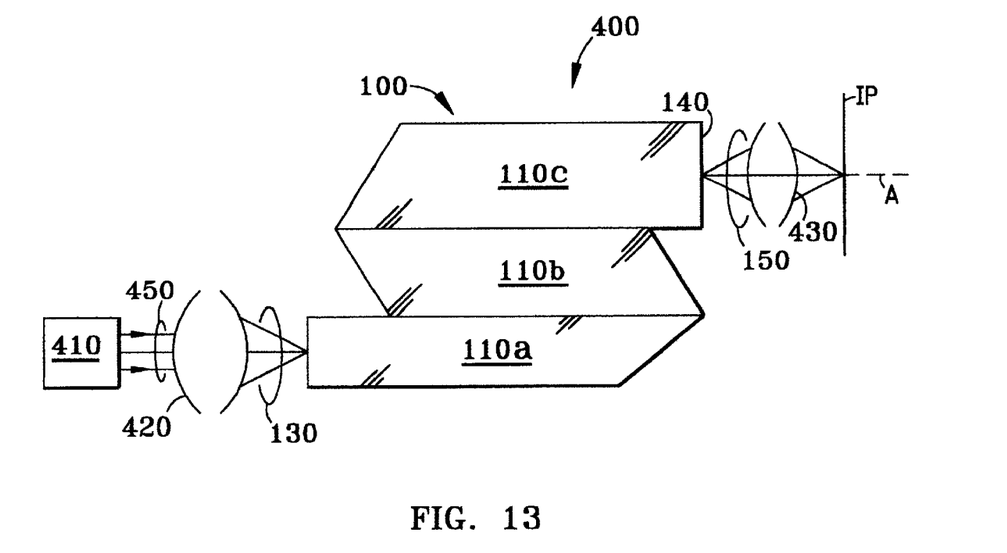
FIG. 13 is a schematic cross-sectional diagram of an optical system including the two-dimensional light tunnel of FIG. 5.

With reference now to FIG. 13, there is shown an optical system 400 having a folded optical axis A and comprising, in order along the optical axis, a light source 410, a first relay optical system 420, a 2-D folded light tunnel 100 having three prisms 110a–110c, and a second relay optical system 430, and an image plane IP.

In operation, a light beam 450 emanating from light source 410 is collected by first relay optical system 420 and input as input beam 130 into light tunnel 100 at input end 120. Light beam 450 is then uniformized by the multiple reflections within the tunnel, as described above, and exits output end 140 as spatially uniformized output beam 150. The latter is then collected by second relay optical system 430, which relays the light to the image plane IP. This relay process preferably involves forming an image of output end 140 onto image plane IP. Image plane IP may be, for example, a plane that needs to be imaged uniformly, such as a reticle plane in a photolithography stepper, or a substrate plane in a laser thermal processing (LTP) apparatus for processing substrates using intense, uniform pulses of light.

Figure 14:
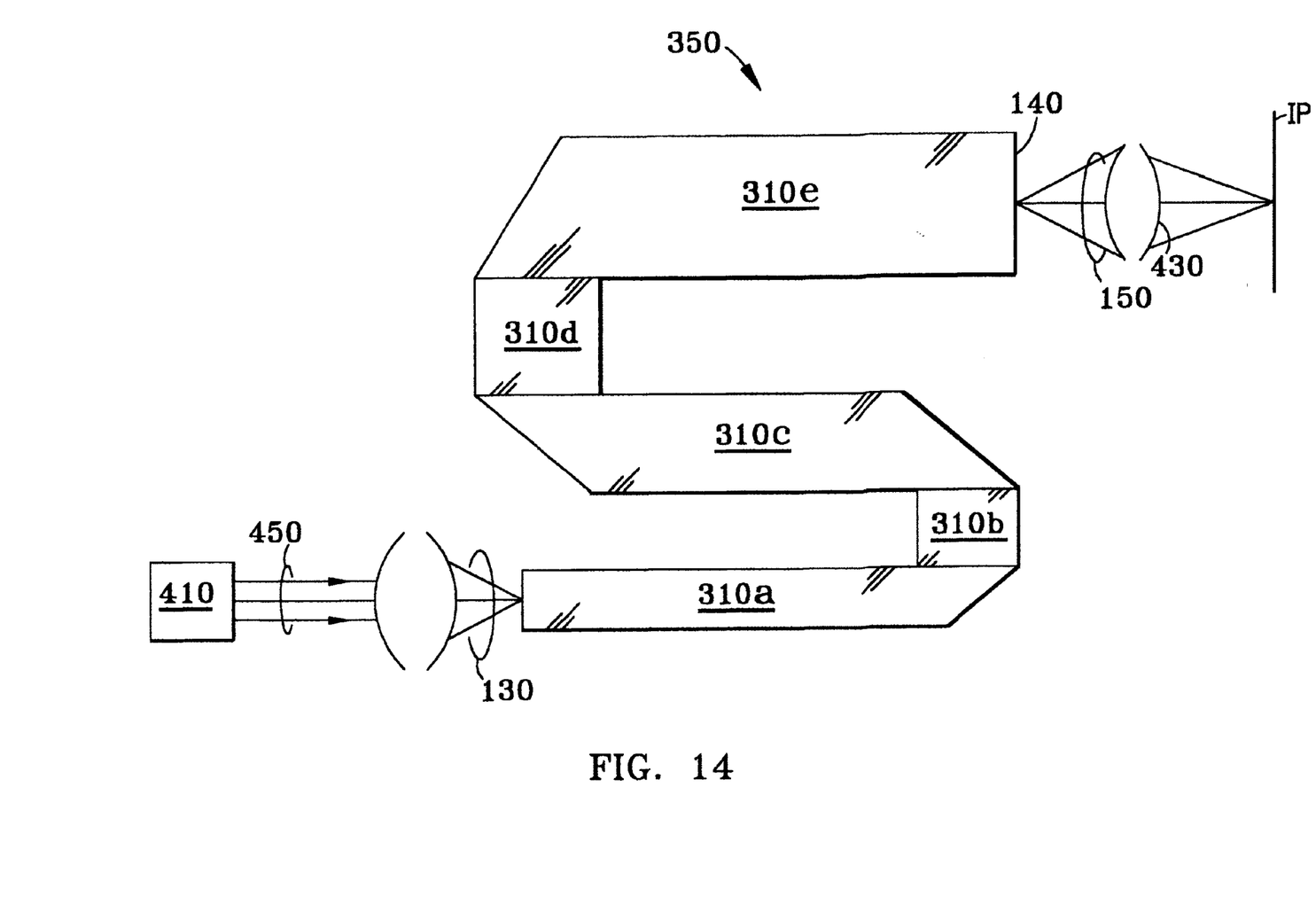
FIG. 14 is a schematic cross-sectional diagram of an optical system including the three-dimensional light tunnel of FIG. 11.

With reference now to FIG. 14, there is shown an optical system 500 that is essentially the same optical system as optical system 400 of FIG. 13, except that 2-D light tunnel 100 is replaced with 3-D light tunnel 350 having five prisms. Light tunnel 400 can also be replaced with light tunnel 300 having three prisms and suitably arranging the first and second relay optical systems 420 and 430 along parallel axes.

It will be noted by those skilled in the art that the above description referred to rectangular and square light tunnels for ease of explanation, and that the principles apply directly to n-sided polygonal prisms (e.g., hexagonal, octagonal cross-sections). In fact, while the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A folded light tunnel apparatus for receiving light having an input angle $\alpha$ and a first refracted angle $\alpha'$ at an input end, and capable of guiding the light to an output end, comprising:
   a) a plurality of prisms each having a refractive index, a cross-sectional dimension and at least one beveled end having a corresponding bevel angle and a corresponding beveled end face;
   b) wherein said plurality of prisms are arranged adjacent one another in a two-dimensional stack, with each said beveled end face arranged adjacent another said beveled end face such that light reflected from one said beveled end is received by said adjacent beveled end face and coupled into the adjacent prism; and
   c) wherein $W_m$ and $W_{m+1}$ are cross-sectional dimensions of adjacent prisms and are related by a scaling factor K given by $$K = W_{m+1}/W_m = \{(1+(1-(2\cos\alpha'-1)^2)^{1/2})\}/(2\cos\alpha'-1).$$

2. An apparatus according to claim 1, further including a gap between each of said beveled end faces of adjacent prisms.

3. An apparatus according to claim 2, wherein said gap is filled with a material having a refractive index lower than the refractive index of the prisms adjacent said gap.

4. An apparatus according to claim 1, wherein said refractive index is the same for all prisms.

5. An apparatus according to claim 1, wherein at least one of the input end and the output end have an anti-reflection coating.

6. An apparatus according to claim 1, wherein said prisms are hollow and comprise reflective walls.

7. An apparatus according to claim 6, wherein said reflective walls include a reflection coating.

8. An apparatus according to claim 1, comprising an odd number of prisms.

9. An apparatus according to claim 1, wherein said beveled ends form a 45 degree angle.

10. An apparatus according to claim 1, wherein the unfolded length of the equivalent unfolded light tunnel has an aspect ratio of 100:1 or greater.

11. An apparatus according to claim 1, wherein the scaling factor K is increased such that an optical axis corresponding to the path the light travels through the prisms is made coincident with the axes passing longitudinally through the centers of the prisms.

12. An apparatus according to claim 1, wherein an amount of surface roughness is provided to at least one of the input and output ends of the light tunnel.

13. An apparatus according to claim 1, wherein a diffracting pattern is provided on at least one of the input and output ends of the light tunnel.

14. An apparatus according to claim 1, wherein said prisms have a cross-sectional shape that is polygonal.

15. An apparatus according to claim 14, wherein said polygonal cross-sectional shape is rectangular.

16. An apparatus according to claim 15, wherein said bevel angle is 45 degrees.

17. A folded light tunnel apparatus for receiving light having an input angle $\alpha$ and a first refracted angle $\alpha'$ at an input end and capable of guiding the light to an output end, comprising:
   a) a plurality of prisms each having a refractive index, a cross-sectional dimension and at least one beveled end, a corresponding bevel angle and a corresponding beveled end face;
   b) wherein said plurality of prisms are arranged in a three dimensional stack, with the beveled end faces placed adjacent one another such that light reflected from said beveled ends is received by said adjacent beveled end face and coupled into the adjacent prism; and
   c) wherein $W_m$ and $W_{m+1}$ are cross-sectional dimensions of adjacent prisms are related by a scaling factor K' given by:

$$K' = W_{m+1}/W_m = 1 + \{(\sin\alpha)/((n^2 - \sin^2\alpha)^{(1/2)})\}.$$

18. An apparatus according to claim 17, further including a gap between each of said beveled end faces of adjacent prisms.

19. An apparatus according to claim 18, wherein said gap is filled with a material having a refractive index lower than the refractive index of the prisms adjacent said gap.

20. An apparatus according to claim 17, wherein said refractive index is the same for all prisms.

21. An apparatus according to claim 17, wherein at least one of the input end and the output end have an anti-reflection coating.

22. An apparatus according to claim 17, wherein said prisms are hollow and comprise reflective walls.

23. An apparatus according to claim 22, wherein said reflective walls include a reflection coating.

24. An apparatus according to claim 15, comprising an odd number of prisms.

25. An apparatus according to claim 17, wherein said beveled ends form a 45 degree angle.

26. An apparatus according to claim 17, wherein the unfolded length of the equivalent unfolded light tunnel has an aspect ratio of 100:1 or greater.

27. An apparatus according to claim 17, wherein the scaling factor K is increased such that an optical axis corresponding to the path the light travels through the prisms is made coincident with the axes passing longitudinally through the centers of the prisms.

28. An apparatus according to claim 17, wherein an amount of surface roughness is provided to at least one of the input and output ends of the light tunnel.

29. An apparatus according to claim 17, wherein a diffracting pattern is provided on at least one of the input and output ends of the light tunnel.

30. An apparatus according to claim 17, wherein said prisms have a cross-sectional shape that is polygonal.

31. An apparatus according to claim 17, wherein said polygonal cross-sectional shape is rectangular.

32. An apparatus according to claim 17, wherein said bevel angle is 45 degrees.

33. A method of spatially uniformizing light from a light source using a light tunnel having an input end and an output end, comprising the steps of:
   a) coupling the light from the light source into the input end of a first prism at an input angle α, the first prism having a refractive index n, a first width $W_1$, a first beveled end and a corresponding first beveled end face, such that the light is guided within the first prism to the first beveled end;
   b) reflecting the light guided by the first prism at the first beveled end of the first prism so that the light reflects through the first beveled end face;
   c) coupling the reflected light from said step b) into a second prism having a second width $W_2$, a second beveled end and a corresponding second beveled end face, through the second beveled end face, wherein said second width $W_2$ is related to said first width $W_m$ via the relation:

$$K=W_2/W_1=\{(1+(1-(2\cos\alpha'-1)^2)^{(1/2)}\}/(2\cos\alpha'-1)$$

wherein α' is given by $\alpha'=\text{ArcSin}\{(\sin\alpha)/n\}$;
   d) reflecting the light coupled in the second prism at the second beveled end so as to guide the light through the second prism; and
   e) outputting the light at the output end of the light tunnel.

34. A method according to claim 33, wherein the endmost prism is said second prism and the output end is an end of said second prism opposite said second beveled end.

35. A method of spatially uniformizing light from a light source using a light tunnel having an input end and an output end, comprising the steps of:
   a) coupling the light from the light source into the input end of a first prism at an input angle α, the first prism having a refractive index n, a first width $W_1$, a first beveled end and a corresponding first beveled end face, such that the light is guided within the first prism to the first beveled end;
   b) reflecting the light guided by the first prism at the first beveled end of the first prism so that the light reflects through the first beveled end face;
   c) coupling the reflected light from said step b) into a second prism having a second width $W_2$, a second beveled end and a corresponding second beveled end face, through the second beveled end face, wherein said second width $W_2$ is related to said first width $W_m$ via the relation:

$$K'=W_2/W_1=1+\{(\sin\alpha)/((n^2-\sin^2\alpha)^{(1/2)})\};$$

d) reflecting the light coupled in the second prism at the second beveled end so as to guide the light through the second prism; and
   e) outputting the light at the output end of the light tunnel.

36. A method according to claim 35, wherein the endmost prism is said second prism and the output end is an end opposite said second beveled end.

37. An light tunnel optical system having an image plane and comprising, in order along a folded optical axis:
   a) a light source capable of emitting light;
   b) a first relay optical system for receiving and relaying the light emitted from the light source;
   c) the light tunnel according to claim 1, arranged to receive light relayed from said first relay optical system at the input end and output spatially uniformized light at the output end; and
   d) a second relay optical system arranged to receive the spatially uniformized light from the light tunnel output end and relay the spatially uniformized light to the image plane.

38. An light tunnel optical system having an image plane and comprising, in order along a folded optical axis:
   a) a light source capable of emitting light;
   b) a first relay optical system for receiving and relaying the light emitted by the light source;
   c) the light tunnel according to claim 14, arranged to receive light relayed from said first relay optical system at the input end and output spatially uniformized light at the output end; and
   d) a second relay optical system arranged to receive the spatially uniformized light from the light tunnel output end and relay the spatially uniformized light to the image plane.

* * * * *